United States Patent [19]

Beverly, II et al.

[11] Patent Number: 5,006,790
[45] Date of Patent: Apr. 9, 1991

[54] ELECTRONIC THERMAL DEMAND MODULE

[75] Inventors: William C. Beverly, II, Davidson; Michael B. Dalton, Pineville; David Q. Gaddis, Charlotte, all of N.C.

[73] Assignee: Appalachian Technologies Corporation, Charlotte, N.C.

[21] Appl. No.: 109,776

[22] Filed: Oct. 19, 1987

[51] Int. Cl.⁵ .................. G01R 21/133; G01R 5/22
[52] U.S. Cl. .................. 324/104; 324/142; 324/74; 324/103 R
[58] Field of Search ............ 324/142, 104, 106, 156, 324/157, 103 R, 130, 74; 364/483, 492, 571.01, 571.04, 573; 29/592.1, 593, 595, 401.1

[56] References Cited

U.S. PATENT DOCUMENTS

| | | | |
|---|---|---|---|
| 4,077,061 | 2/1978 | Johnston et al. | 364/492 |
| 4,079,313 | 3/1978 | Callan | 324/142 X |
| 4,121,147 | 10/1978 | Becker et al. | 324/156 X |
| 4,163,936 | 8/1979 | Halstead et al. | 324/104 X |
| 4,282,576 | 8/1981 | Elms et al. | 324/142 X |
| 4,581,705 | 4/1986 | Gilker et al. | 364/483 X |
| 4,605,842 | 8/1986 | Losapio | 364/483 X |
| 4,627,000 | 12/1986 | Germer | 364/483 X |
| 4,628,257 | 12/1986 | Kusters et al. | 324/142 X |
| 4,713,609 | 12/1987 | Losapio et al. | 324/156 X |
| 4,774,621 | 9/1988 | Andow | 364/492 |
| 4,837,504 | 6/1989 | Baer et al. | 324/74 |

Primary Examiner—Kenneth Wieder
Assistant Examiner—Vinh P. Nguyen
Attorney, Agent, or Firm—James B. Hinson

[57] ABSTRACT

A utility meter including an electronic module to calculate predetermined parameters related to electric utility line and load conditions. Signals related to utility line voltage and load conditions are scaled and sampled to generated a data base which is utilized by a digital processor to calculate the parameters discussed above. Calibration processes controlled by the processor corrects for errors related to the sensors used to sense line voltage and load conditions as well as drift in the analog portions of the electronic module.

4 Claims, 8 Drawing Sheets

ELECTRONIC THERMAL DEMAND MODULE

BACKGROUND OF THE INVENTION

1. Field of the Invention

The invention relates to electrical instrumentation and more particularly to electric utility meters utilizing electronic circuitry to simulate the thermal demand curve and to calculate selected parameters related to electric power usage.

2. Definitions

For purposes of describing the subject invention, the following definitions are used throughout the application.

En—is defined as a number representative of the amplitude of the output signal of a line voltage sensor associated with the utility meter.

In—is defined as a number representative of the amplitude of the output signal of the line current sensor associated with the utility meter.

Qi—is defined as a number representative of the product of En and In, with In shifted eighty degrees. $Qi = I_n E_n$ Wi—is defined as a number representative of the product of (En) and (In) $(I_n E_n)$ Q—is defined as a number representative of the integrated value of Qi.

Watts—is defined as a number representative of the integrated value of Wi.

VARS—is defined as a number representative of the product of the line voltage and reactive line current.

VA—is defined as a number representative of the product of the line voltage and the line current.

VAL—is defined as a number representative of the product of the line voltage and the line current linearized.

VAth—is defined as a number representative of the product of the line voltage and the line current adjusted to the thermal demand curve.

TC—is defined as a number representative of the constant used to adjust real time parameters to the thermal demand curve.

VApk—is defined as a number representative of the peak of the product of the line voltage and the line current.

SUMMARY OF THE PRIOR ART

Prior art thermal demand meters were generally of the electro-thermal, mechanical type. While these meters functioned as designed, they were relatively limited in that the characteristics of the meters were determined by the electro-mechanical components. Additionally, the accuracy of these meters was normally in the range of plus or minus 2%.

Greater flexibility and accuracy is provided by the present invention. This additional flexibility results from utilizing a microprocessor based electronic thermal demand module to calculate parameters associated with electric power usage. Any calculations can be performed so long as suitable computer programs and data are provided.

In addition to the capability of calculating parameters not provided by prior art electric utility meters, the accuracy of calculated parameters is also increased by at least an order of magnitude as compared to prior art utility meters. This improved accuracy results from a combination of factors including, but not limited to, the inherent accuracy of the calculations using the microprocessor as well as the self calibration routines which are executed periodically under the control of the microprocessor.

SUMMARY OF THE INVENTION

The preferred embodiment of the invention provides an electronic thermal demand module for conveniently updating and improving the performance of electric thermal demand meters. A programmed microprocessor is utilized to calculate the traditional thermal demand parameters related to electric power usage using signals provided by the utility meter sensors. This electronic thermal demand module can also be used instead of the traditional electro-mechanical thermal demand module in manufacturing electric utility meters. That is, the module is mounted inside the electric utility meter cover in the position provided for mounting the standard electro-mechanical thermal demand module.

In summary, signals related to the usage of electric power are provided to the electronic thermal demand module from the traditional voltage and current transformers included in the electric utility meter. Operating power is provided from the AC power line. Any voltage or current related quantity can be calculated utilizing signals provided by the utility meter sensor. The most useful feature of the electronic thermal demand module is believed to be its use as a replacement for electro-mechanical modules performing this function. The results of these calculations are displayed on a visual display permitting the value of these parameters to be readily obtained. Additionally, a serial interface is provided, permitting the results of these calculations to be electronically communicated to other systems.

Additionally, the direct replacement feature permits existing thermal demand meters to be upgraded by removing the traditional electro- mechanical thermal demand module and inserting the electronic thermal demand meter module. Therefore, a useful aspect of the invention is currently believed to be its compatibility with conventional wattmeters permitting the performance of these meters to be upgraded without design modifications.

DETAILED DESCRIPTION

Figure 1:
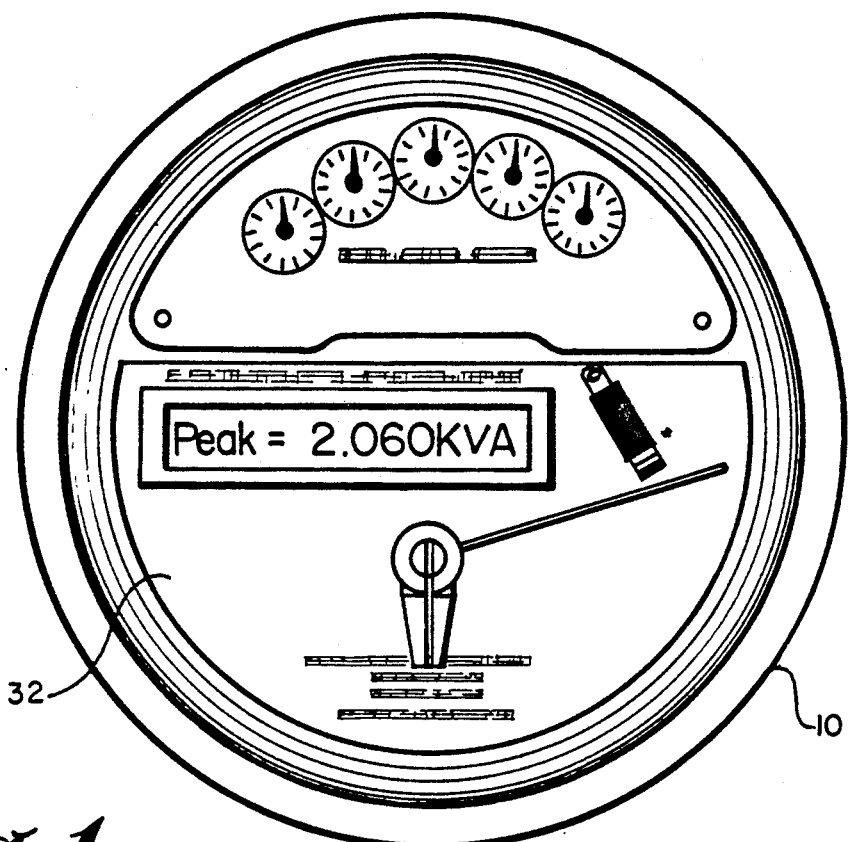
FIG. 1 is a front view of an electric utility meter, which includes the electronic thermal demand module which comprises the preferred embodiment of the invention.

An electric utility meter utilizing the electronic thermal demand module is illustrated in front view of FIG. 1. Improved operation is provided by a solid state microprocessor based thermal demand module for calculating parameters related to power usage and other parameters of interest in evaluating power usage of the quality of the electric service.

The electronic thermal demand module includes a programmed micro-processor module. The number and type of calculations which can be made are determined by the capability of the microprocessor, the number and types of data signals available and the complexity of the microprocessor software. In its current configuration, calculations are limited to those which can be performed using signals produced by sensors forming a part of conventional utility meters.

The thermal demand module is designed as a replacement for the electro-mechanical thermal demand apparatus of conventional meters. The basic design is adaptable to meters supplied by various manufacturers. Reset signals are supplied to the electronic thermal demand module using the conventional reset apparatus 11, which is mounted in the electric utility meter cover.

Signals related to electric power usage are provided to the electronic thermal demand module by sensors. Usable sensors include the conventional line voltage and line current transformers as well as the rectifier bridges used in conjunction with electro-mechanical thermal demand meters. Other sensors not currently used in utility meters may be adapted for as long as an electrical signal of a usable amplitude and having a predetermined relationship to the parameter being measured is produced.

Functionally, the electric utility meter illustrated in FIG. 1 comprises a conventional thermal demand meter with the electro-mechanical thermal demand components removed and replaced by the electronic thermal demand module. As previously discussed, this approach permits existing electric utility meters to be updated to provide accurate, flexible and reliable calculations of power usage service quality related parameters.

Basically, the development model of the electronic thermal demand module digitizes signals related to up to three phases of line voltage and line current with the number of parameters digitized depending on the type of meter. Utilizing these digitized values, the kilowatts and kilovars are calculated by integration using the trapezoidal rule. The instantaneous KVA is then calculated by taking the square root of the KW squared plus KVA squared. An emulation technique is utilized to electronically reproduce the standard thermal demand curve.

Peak KVA is determined by saving the highest calculated value since the last demand reset signal. Other calculations can be implemented to calculate service quality parameter such as voltage variations by providing suitable programming for the microprocessor program. The electronic thermal demand module is not limited to analyzing any specific number of phases. That is, the circuitry and the programs can be modified to implement one phase or any desired number of phases.

Figure 2:
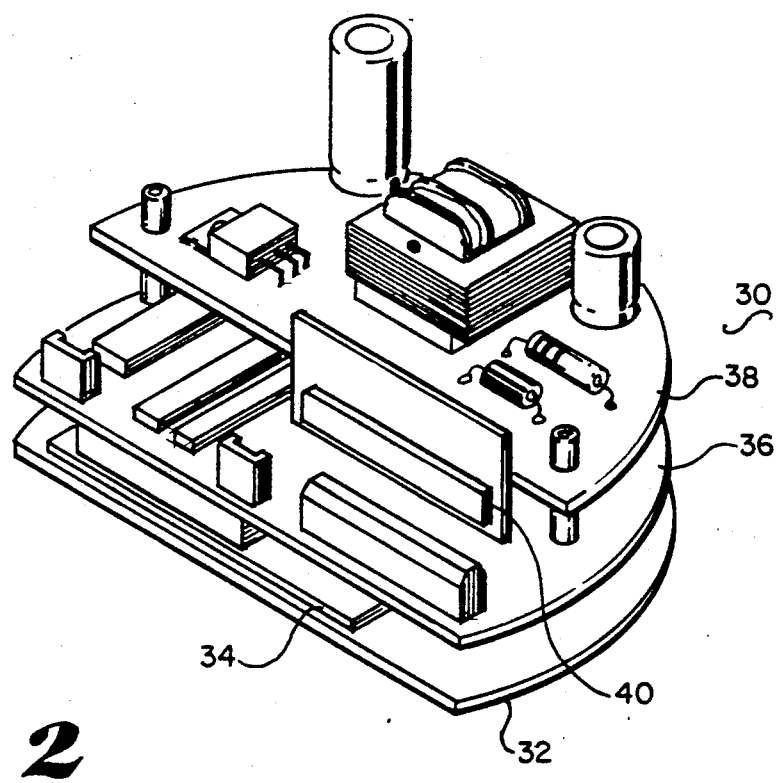
FIG. 2 is a pictorial view of the electronic thermal demand module.

The electronic electronic thermal demand module is illustrated in isometric view in FIG. 2. More specifically, the electronic thermal demand module is semi-circular in shape and designed to mount inside the electric utility meter cover utilizing the same hardware as the conventional electro-mechanical thermal demand apparatus. The details of the mounting hardware depends on the meter type and manufacturer.

More specifically, the electronic thermal demand module includes a front panel 32 which is visible through the cover of the electric utility meter when the module is installed as illustrated in FIG. 1. A multiple digit liquid display device 34 is mounted behind the front panel 32 and is visible through an opening in this panel, as indicated in FIG. 1. Calculated parameters are displayed with the parameter to be displayed selectable using signals from conventional on/off switches. The standard reset lever 11 operates a microswitch 13 to provide reset signals to the electronic thermal demand module.

Sufficient space on circuit boards for all the electronic components is provided by utilizing a stacked arrangement of circuit boards. In the preferred and experimental model, two stacked circuit boards 36 and 38 were utilized. The various circuit boards are coupled together using multi-pin connectors mounted on the circuit boards. Other arrangements utilizing other electronic components might require more or less circuit boards depending on the circuit components selected to implement the electronic thermal demand module and other optional design factors.

Early in the development, it was realized that it is desirable to utilize the same electronic thermal demand module with a variety of electric utility meters. It was also realized that significant differences are present in the characteristics of the signals available from various electric power utility meters. To permit the electronic thermal demand module to be used with electric utility meters of various types, a meter ID board is utilized to modify the input signals to produce standardized data signals and to provide a meter type identification signal. This meter ID board is identified by reference numerals 40 and is plugged into the circuit board 36. Additionally, mechanical brackets are provided for mounting the electronic thermal demand module in the space normally by the electro-mechanical thermal demand apparatus. Electric utility meters to which the module has been successfully adapted and tested include those manufactured by Westinghouse Electric, and Sangamo with each application using an identical version of the electronic thermal demand module except for the meter ID board 40 and the mounting hardware.

Although all of the circuit's components utilized in the electronic thermal demand module are not clearly visible in FIG. 2, a detailed schematic diagram of the electronic portions of the electronic thermal demand module is discussed later. The specific components or their arrangement are not critical as long as the required functions are provided. Thus no details of the component location is included, since the location of all components is optional with the designer.

Figure 3:
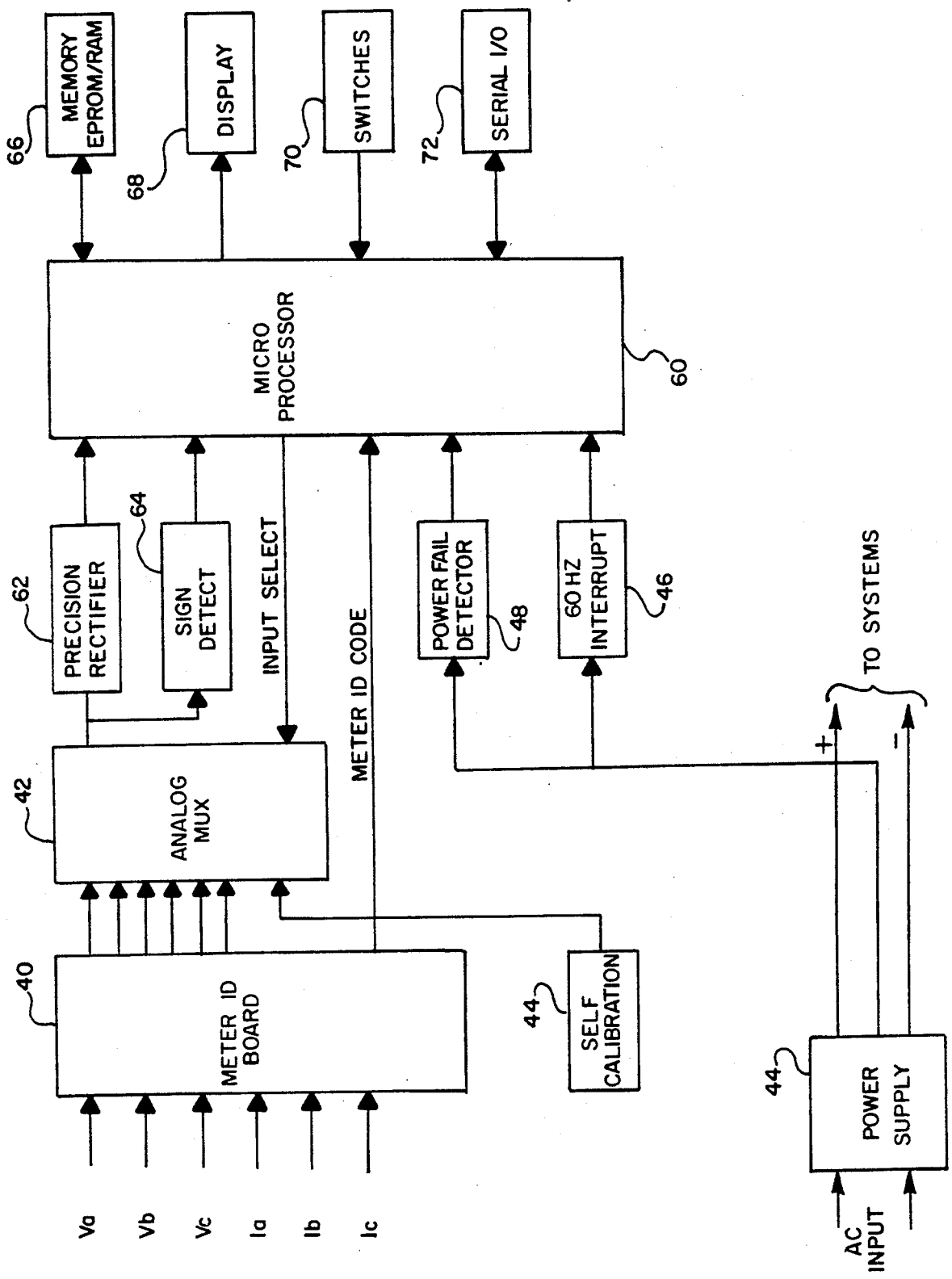
FIG. 3 is a functional block diagram of the electronic thermal demand module.

FIG. 3 is a functional block diagram of the preferred embodiment of the electronic thermal demand module. In this embodiment, signals related to three phases of a conventional AC power line are coupled from the voltage and current transformers of the electric utility meter as input signals to a meter ID board 40. These signals are modified as required by the meter ID 40 to provide input signals representing these parameters and having a standardized maximum value. These standardized input signals are coupled to the input of an analog multiplexor 42. A second input to the analog multiplexor 42 is provided by a self calibration circuit 44. Functionally, this circuit permits the use of a programmed calibration routine executed by the microprocessor 60 to periodically calibrate the system and correct for circuit changes primarily due to temperature variations. A code (meter ID code) is also generated by the meter ID board 40 and coupled to the microprocessor 60 to permit the microprocessor 60 to adjust the calculations for the type of electric utility meter being used.

Operational power is provided to the components of the electronic thermal demand module by a power supply 44 which in turn receives its operating power from the AC power line associated with the electric utility meter. Periodic (60 Hertz) interrupt signals are generated by the interrupt circuit 46. These interrupt signals may not be used in all installations, depending on the software used and the type of calculations implemented.

Also the power fail detector 48 monitors the output voltage of the power supply and provides a signal to the micro-processor 60 to assure an orderly shut down when the AC input power fails.

The analog output of the multiplexor 42 is a standardized AC signal as previously discussed. Such a signal is not directly utilizable by the micro-processor 60 used in the experimental embodiment of the invention. This feature of the microprocessor 60 requires that the AC output of the analog multiplexor 42 be converted to a rectified AC (pulsating DC) signal by a precision rectifier 62 to produce analog input signals to the microprocessor 60. The calculations implemented using these pulsating DC signals also requires a signal identifying the polarity of the AC input signal associated with each pulse of the pulsating DC signal. Such information is provided to the microprocessor 60 by a sign detect circuit 64.

Maximum flexibility is provided by storing the operational programs for the micro-processor 60 in an EPROM memory. This prevents loss of the programs when power is lost or the circuitry is de-energized. Additionally, the micro-processor 60 utilizes random access volatile memory for storing data and parameters utilized in the calculation. Both of these memory functions are collectively represented by memory modules 66. Additionally, EEPROM memory is utilized to retain calculated values when electric power is turned off.

Flexibility in displaying data and the results of calculations was previously discussed. Fundamentally, any convenient type of display which is capable of being updated and operated by the micro-processor 60 can be utilized. In the developmental model the display was a liquid crystal digital display panel and is functionally represented at reference numeral 68. Discrete input signals to select the mode of the electronic thermal delay module as well as meter reset functions are provided by on-off type mechanical switches. Such inputs are functionally illustrated at reference numeral 70. Reset signals are provided using the standard reset mechanism as previously discussed. Suitable switches are provided on the module to select the mode. Changing the mode requires removal of the meter cover. However, the meter could be modified to mount these switches externally.

Additionally, a serial input/output data buss is provided permitting convenient bi-directional communication between the microprocessor 60 and external digital devices. This IO is functionally illustrated at reference numeral 72 and may be adapted to utilize standard format such as RS 232.

Figure 4:
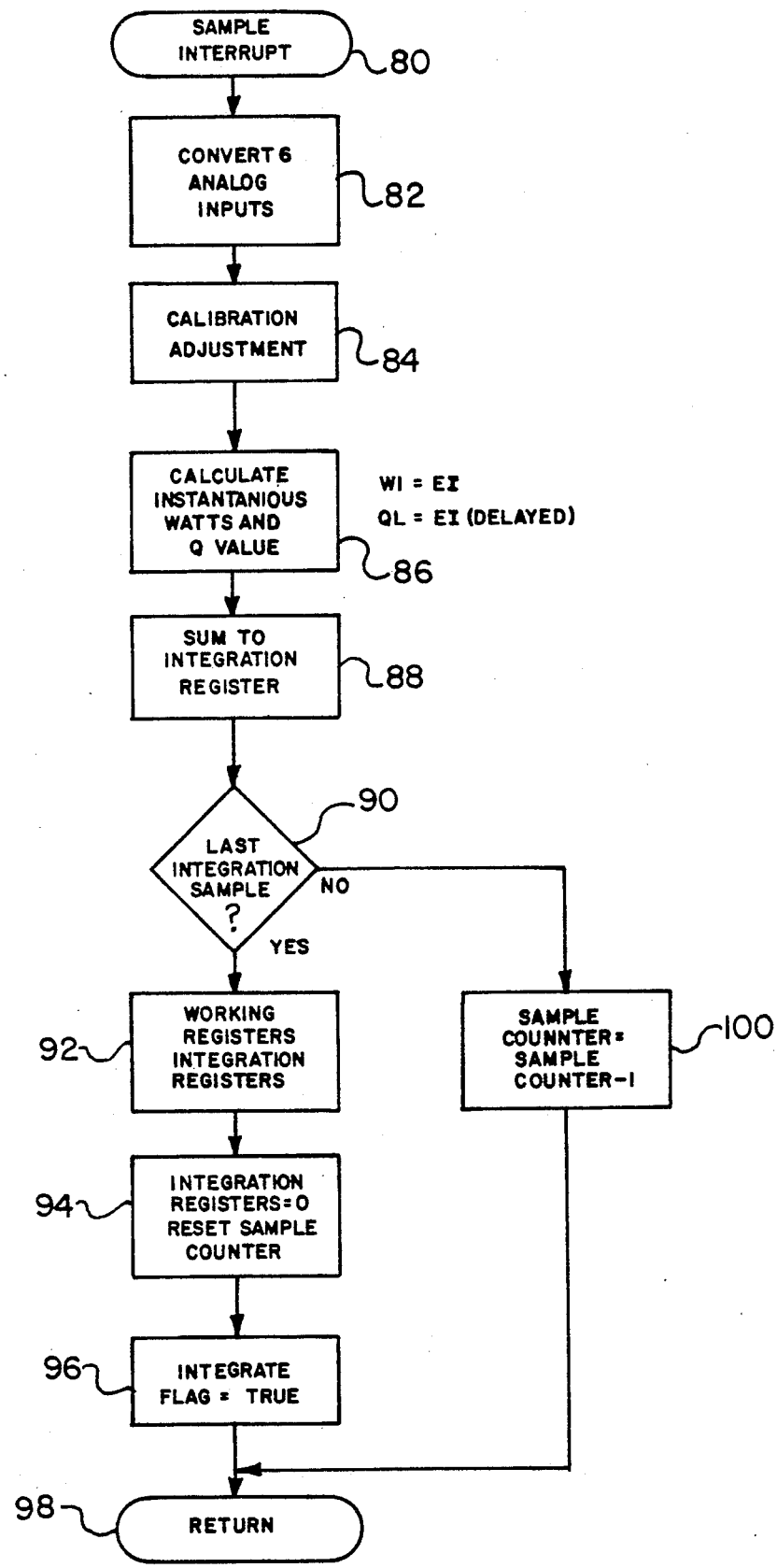
FIG. 4 and FIG. 5 are flow charts illustrating the microprocessor program utilized in conjunction with the electronic thermal demand module.
Figure 5:
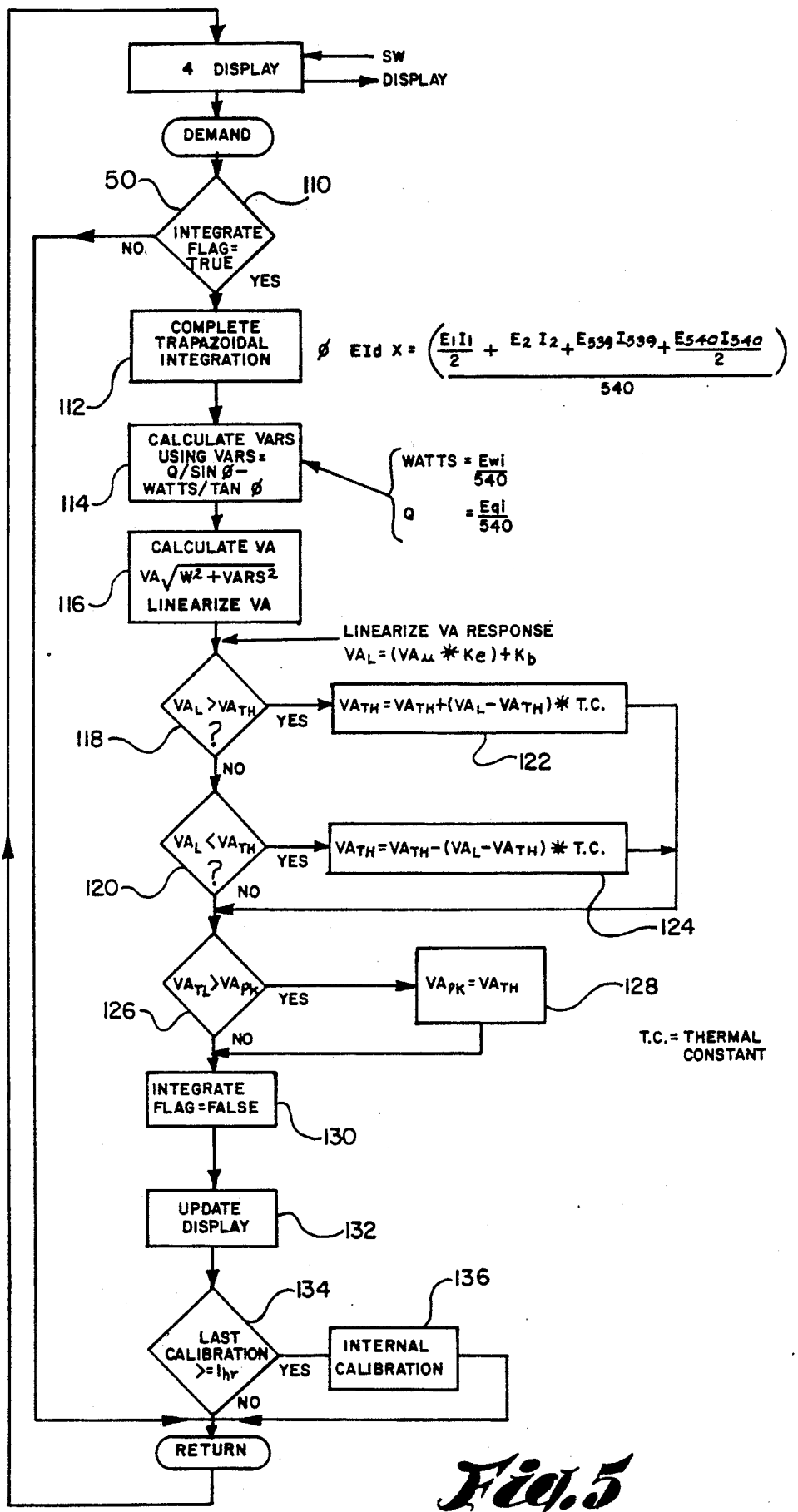

The combination of FIGS. 4 and 5 comprises a flow chart illustrating the operation of the electronic thermal demand module. More specifically, the microprocessor utilizes an internal timer to initialize a data collection cycle causing the electronic thermal demand module to sample six analog inputs signals related to the line voltage and line current conditions currently being measured by the associated electric utility meter. These interrupts and the associated data collection cycle are respectively functionally illustrated at reference numeral 80 and 82.

Various calibration adjustments are required to convert the raw analog output signals from the electric utility meter into true values. The details of these calculations depend upon the individual installation. A self calibration signal from the self calibration circuit 44 permits the microprocessor to adjust the calculations to compensate for errors which are primarily due to temperature changes.

After the necessary calibration adjustments have been performed, the micro-processor 60 calculates the instantaneous watts and Q and sums these values in an integration register. These operations are functionally illustrated at reference numerals 86 and 88 with the results of this operation being utilized to perform the trapezoidal integrations as previously discussed.

In performing the trapezoidal integration, it is first necessary to determine if the proper number of data samples have been collected. The step of checking the required number of data samples, is functionally illustrated at reference numeral 90. Assuming that the proper number of samples have been collected, the temporary or working registers associated with the calculations are set to the same value as the integration registers and the counter indicating the number of samples stored in the integration register is reset to zero. Also, the integration registers are cleared. These functional steps are illustrated at reference numeral 92 and 94.

After the information has been transferred to the working registers the integration is complete, a flag indicating its completion is set and the program is returned to the beginning point. These functional steps are illustrated at reference numerals 96 and 98.

Alternatively, if the proper number of samples have not been collected the integration counter is incremented one count and the operation returns to the beginning of the program, as illustrated at reference numeral 98.

The mathematical operations and mode selection functions are illustrated in FIG. 5. Before any calculations are started, it is necessary to determine the mode (select the parameters to be displayed) to which the thermal demand module is to be set, if a reset signal has been received and if the required data samples be collected and integrated as previously discussed. Functionally, this process is illustrated at reference numerals 109 and 110. Signals to select the mode and the reset signals are received from on/off switches, as previously discussed.

Assuming that the data collection cycle has been completed, trapezoidal integration is utilized to calculate the demand with this function being illustrated at reference numeral 112. After the demand has been calculated, the vars (reactive demand) is calculated, the watts are calculated, VA is calculated and the calculated VA is linearized as functionally illustrated at reference numerals 114 and 116.

Simulating the thermal demand curve is accomplished as shown at reference numerals 118, 120, 122 and 124. More specifically, if the most recently calculated demand value is greater than the current thermal demand value, the difference between the demand values [VA1−VAth] is multiplied by a thermal constant and added to the current thermal demand value, as shown at reference numeral 122. Conversely, if the most recently calculated demand value is less than the current thermal demand value, the difference is multiplied by the thermal constant and used to reduce the current thermal demand value as shown at reference numeral 124.

Assuming that the current value is higher than the previous value, the peak output of the thermal demand calculation is retained as illustrated at reference numeral 128. After the thermal demand values have been updated as required, the integrate flag is set to false permitting a second integration cycle to start and the display is updated with these functions illustrated at reference numeral 130 and 132.

The automatic calibration of the electronic thermal demand module is performed each hour or another convenient time interval. Following updating of the display, the time of the last calibration is checked and the calibration is updated as necessary with these functions illustrated at reference numeral 134 and 136. This completes the updating of the calculations with the operation of the program returned to its beginning.

Alternatively, if the check illustrated at reference numeral 110 indicates that the integrate flag is false, the calculations are totally by-passed and operation returns to the beginning of the cycle delaying further calculations until the required data has been collected.

Figure 6:
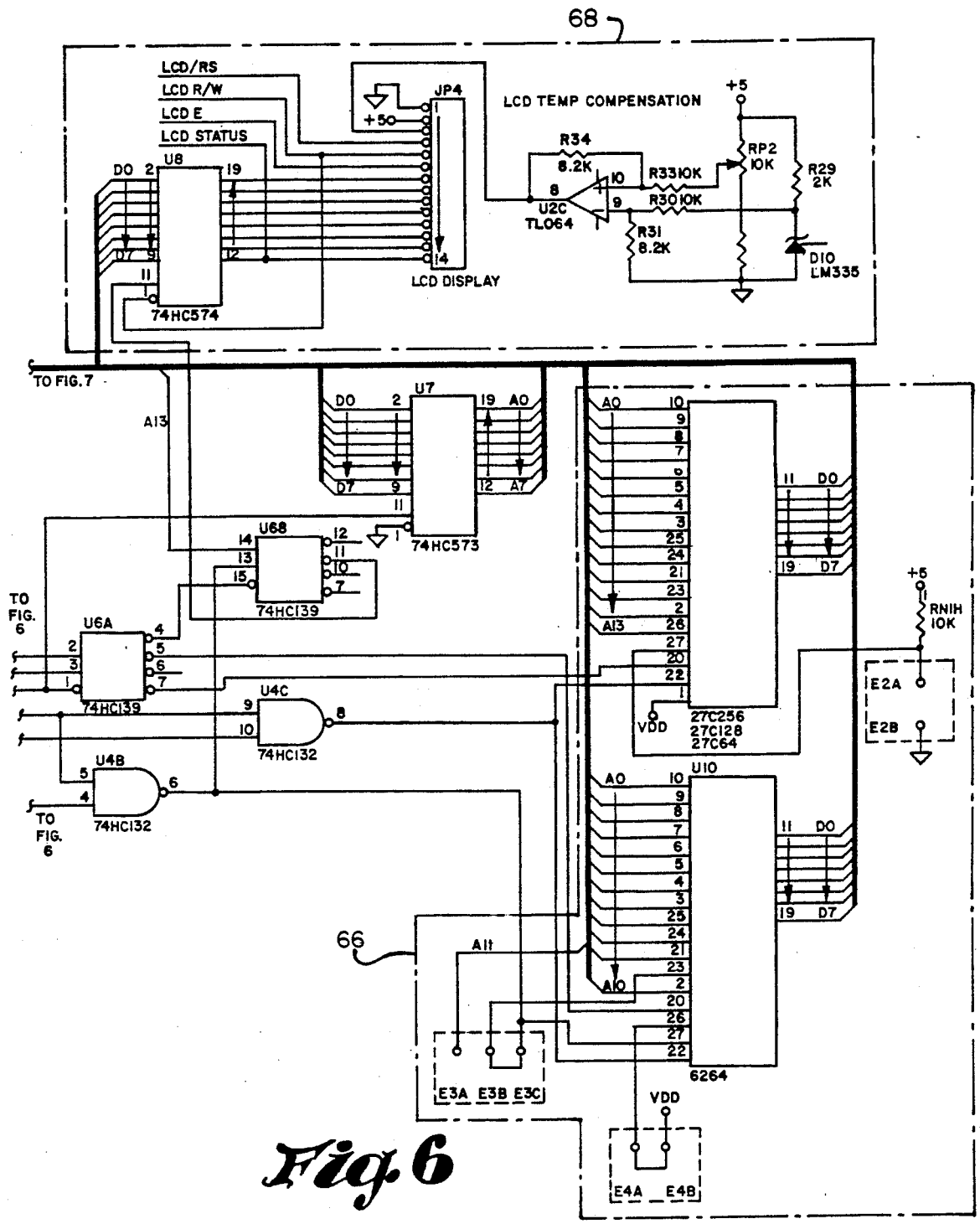
FIGS. 6 in combination with FIG. 7 and FIG. 8 constitutes a complete detailed schematic diagram of the electronic thermal demand module.
Figure 7:
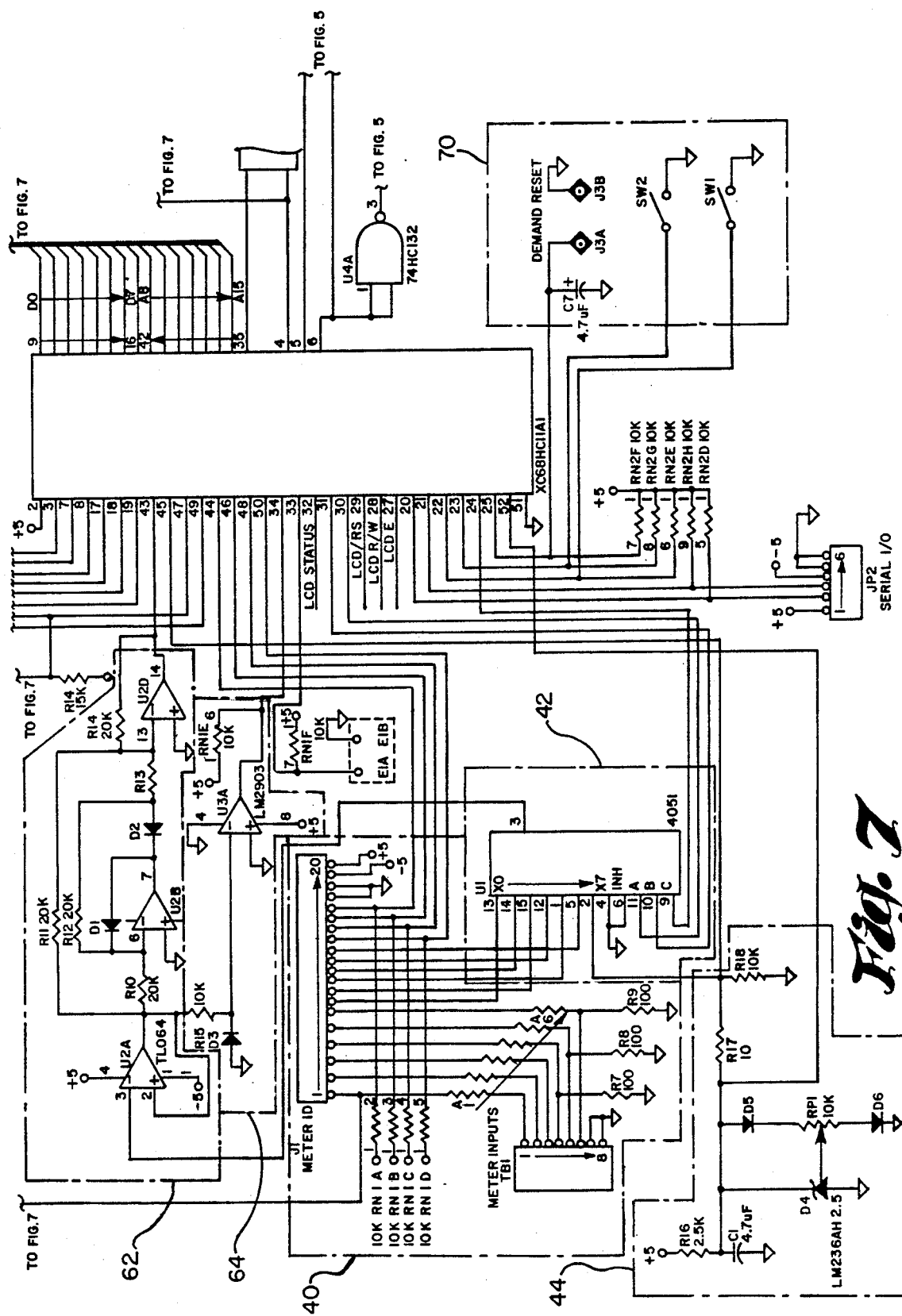
Figure 8:
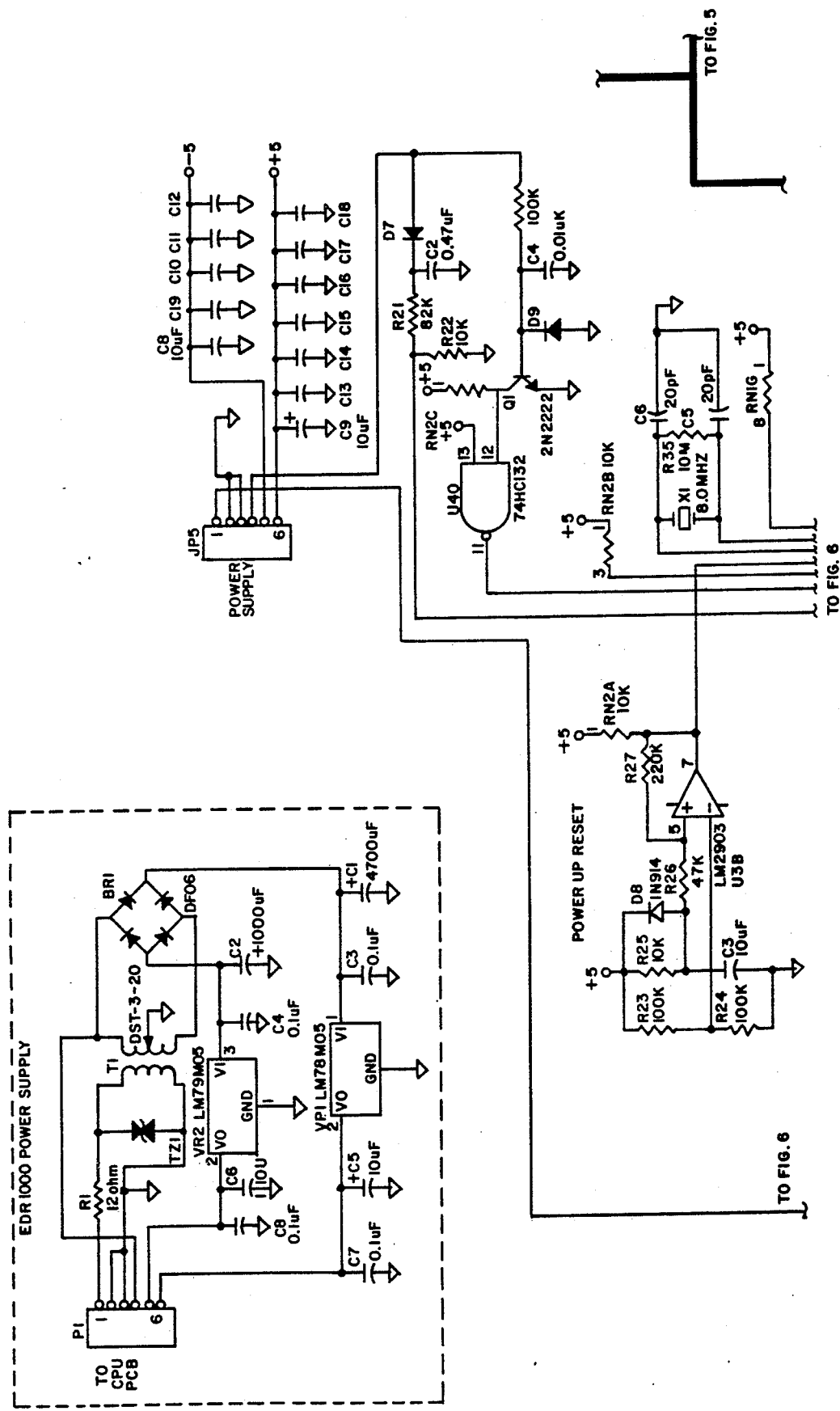

FIGS. 6, 7, and 8 are detailed schematic diagrams for the embodiment of the invention actually built and tested. These diagrams are self explanatory to those skilled in the art and therefore no detailed description of these figures is included.

Figure 9:
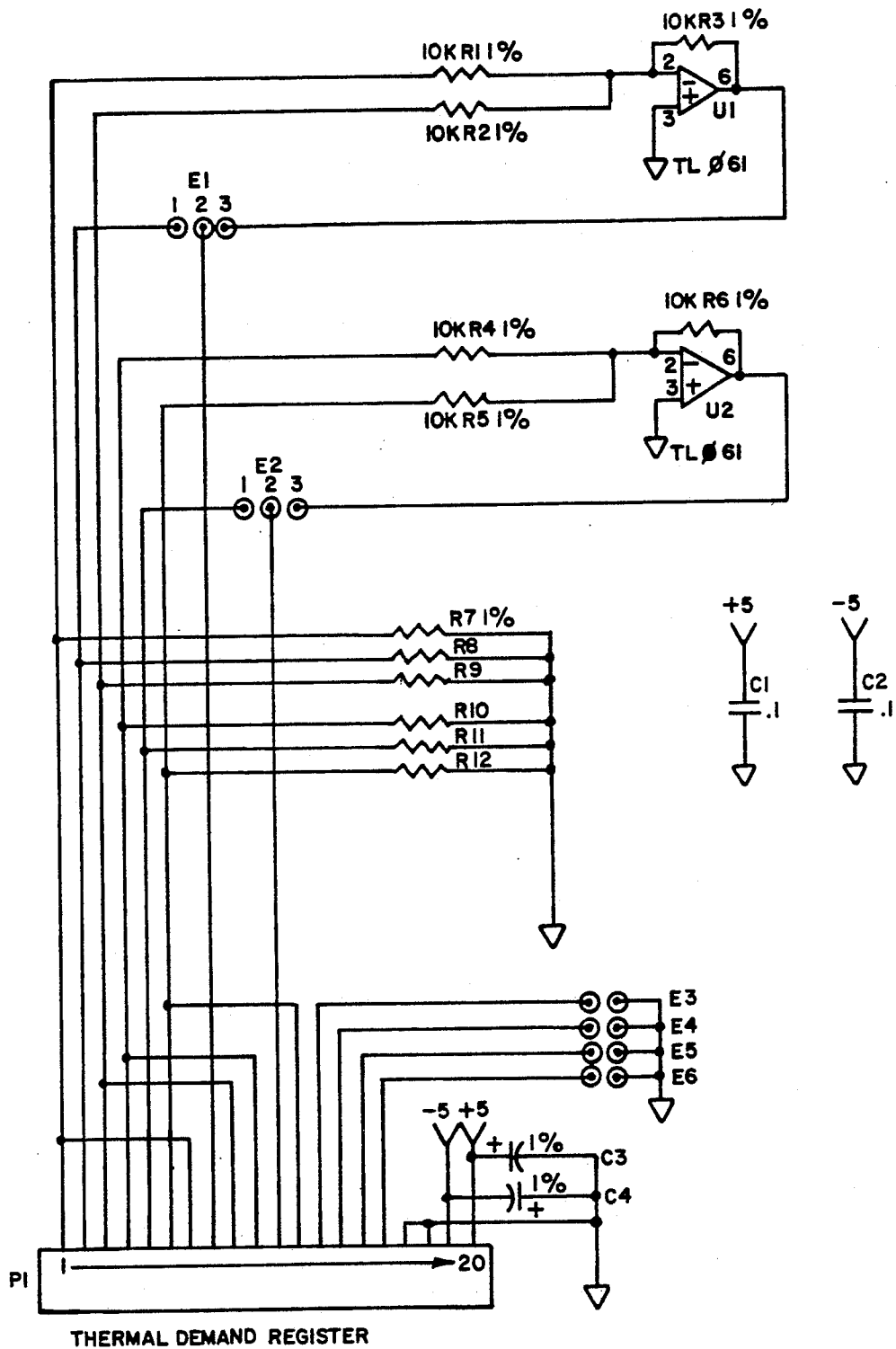
FIG. 9 is a schematic diagram of the meter identification board comprising a portion of the electronic thermal demand module.

Similarly, FIG. 9 is a detailed schematic diagram of the meter ID Board 40. Pins 13 through 16 of the meter ID board 40 are coupled to a plug 140 permitting jumpers to be used to selectively ground these pins to generate up to sixteen unique meter type identification codes. Terminals one through six are loaded with a resistor with terminals one and three, four and six respectively serving as inputs to differential scaling amplifier 142 and 144. Operating power for amplifier 142 and 144 is provided from terminals 19 and 2 with additional filtering provided by capacitors 146 and 148. Thus the meter ID Board 80 provides a means for generating meter ID codes and for scaling signals.

Since FIGS. 6, 7, 8, and 9 are engineering drawings and include all component identified by industry standard part numbers, no line-by-line detailed description is believed to be necessary in order for those skilled in the art to understand and appreciate this the preferred embodiment of the invention. Thus, for reasons of simplicity, a detailed description of these schematic diagrams is not provided.

We claim:

1. Electronic apparatus coupled to receive from a metering connection a plurality of analog voltages representing the instantaneous line voltage and load current values of at least one phase of an electrical utility service entrance and utilizing said analog voltages to selectively calculate and selectively display parameters related to the existing load conditions, said apparatus comprising in combination:

(a) means for receiving and scaling said analog input voltages to produce standardized input signals;

(b) sampling means for repetitively generating digital numbers representative of the instantaneous values of said standardized input signals;

(c) means for correcting said digital numbers for selected variations introduced by said sampling means;

(d) means utilizing said digital numbers to calculate said selected parameters in accordance with predetermined mathematical functions;

(e) means for selectively displaying digital numbers representing the calculated values of said selected parameters in alphanumeric form;

(f) means for selectively setting the digital number representative of selected ones of said parameters to a selected value in response to an input signal;

(g) means for initiation of calibration, display and other sequences associated with said means utilizing said digital numbers.

2. Electronic apparatus coupled to receive from a metering connection a plurality of analog voltages representing the instantaneous line voltage and load current values of at least one phase of an electrical utility service entrance and utilizing said analog voltages to selectively calculate and selectively display parameters related to the existing load conditions, said apparatus comprising in combination:

(a) means for sampling said analog voltage and repetitively generating digital numbers having a predetermined relationship to said analog voltages;

(b) means for correcting said digital numbers for variations introduced by said means for sampling;

(c) means utilizing said digital numbers to calculate said selected parameters in accordance with predetermined mathematical functions;

(d) means for selectively displaying digital numbers representing the calculated values of said selected parameters in alphanumeric form;

(e) means for selectively setting the digital number representative of selected ones of said parameters to a selected value in response to an input signal; and (f) means for initiation of calibration, display and other sequences associated with said means utilizing said digital numbers.

3. Apparatus coupled to receive signals from sensors associated with an electric utility meter, said signals having a predetermined relationship to the electric line voltage and line current conditions and in response thereto calculating selected parameters related to the existing load conditions, said apparatus comprising in combination:

a. first means for receiving said signals from said sensors associated with said electric utility meter and for scaling said signals to preselected maximum amplitudes to produce predetermined input signals;

b. second means responsive to said predetermined input signals to calculate said selected parameters, including power demand calculated in accordance with a simulated thermal demand curve, in accordance with a predetermined mathematical function; and c. third means for accepting at least one input signal and in response thereto calibrating said means responsive to said predetermined input signals;

d. replaceable meter identification means, which includes a circuit board comprising a portion of said apparatus, for providing to said apparatus a signal specifying the characteristics of the electric utility meter being utilized in conjunction with said apparatus;

e. fourth means for calculation of the thermal demand wherein the exponential thermal demand curve is simulated by the following equation:

$$VA = VAth - (VAl - VAth) * TC$$

f. fifth means including a digital interface permitting said apparatus to communicate with other systems.

4. Apparatus coupled to receive signals from sensors associated with an electric utility meter, said signals having a predetermined relationship to the electric line voltage and line current conditions and in response thereto calculating selected parameters related to the existing load conditions, said apparatus comprising in combination:

a. first means for receiving said signals from said sensors associated with said electric utility meter and for scaling said signals to preselected maximum amplitudes to produce predetermined input signals;

b. second means responsive to said predetermined input signals to calculate said selected parameters, including power demand calculated in accordance with a simulated thermal demand curve, in accordance with a predetermined mathematical function; and c. third means for accepting at least one input signal and in response thereto calibrating said second means responsive to said predetermined input signals;

d. replaceable meter identification means which includes a circuit board comprising a portion of said apparatus, for providing to said apparatus a signal specifying the characteristics of the electric utility meter being utilized in conjunction with said apparatus;

e. fourth means including a digital interface permitting said apparatus to communicate with other systems; wherein f. said selected parameters are selectively calculated utilizing a simulated thermal demand curve with the thermal demand curve simulated by an exponential function:

$$VA = VAth +/- (VAl - VAth)TC.$$

* * * * *